(12) United States Patent
Mitsui et al.

(10) Patent No.: US 10,658,921 B2
(45) Date of Patent: May 19, 2020

(54) OVERHEAT PROTECTION CONTROL DEVICE AND VEHICLE-MOUNTED POWER CIRCUIT DEVICE

(71) Applicant: MITSUBISHI ELECTRIC CORPORATION, Chiyoda-ku, Tokyo (JP)

(72) Inventors: Takao Mitsui, Tokyo (JP); Matahiko Ikeda, Tokyo (JP); Masakazu Tani, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 61 days.

(21) Appl. No.: 16/087,752

(22) PCT Filed: Jan. 16, 2017

(86) PCT No.: PCT/JP2017/001206
§ 371 (c)(1),
(2) Date: Sep. 24, 2018

(87) PCT Pub. No.: WO2017/168951
PCT Pub. Date: Oct. 5, 2017

(65) Prior Publication Data
US 2020/0112245 A1    Apr. 9, 2020

(30) Foreign Application Priority Data
Mar. 29, 2016  (JP) .................................. 2016-064989

(51) Int. Cl.
*H01L 23/34*    (2006.01)
*H02M 1/32*    (2007.01)
(Continued)

(52) U.S. Cl.
CPC .............. *H02M 1/32* (2013.01); *H01L 23/34* (2013.01); *H02P 29/68* (2016.02);
(Continued)

(58) Field of Classification Search
CPC ... H01L 23/34; H02M 1/32; H02M 2001/325; H02M 2001/327; H02P 29/68; H03K 17/08122; H03K 2017/0806
(Continued)

(56) References Cited

U.S. PATENT DOCUMENTS 6,268,986 B1    7/2001  Kobayashi et al.
7,590,874 B2 *  9/2009  Chen .................... G06F 1/206
                                                    713/300
(Continued)

FOREIGN PATENT DOCUMENTS

JP    2000-324893 A    11/2000
JP    2005-080417 A    3/2005
(Continued)

OTHER PUBLICATIONS

International Search Report (PCT/ISA/210) dated Feb. 14, 2017, by the Japan Patent Office as the International Searching Authority for International Application No. PCT/JP2017/001206.
(Continued)

*Primary Examiner* — William Hernandez
(74) *Attorney, Agent, or Firm* — Buchanan Ingersoll & Rooney PC (57) ABSTRACT

A plurality of semiconductor elements have sources which are commonly connected, and drains which are commonly connected. A voltage measurement unit measures an ON voltage between the source of a first semiconductor element of the plurality of semiconductor elements and the drain of the first semiconductor element. A determination unit receives information indicating a magnitude of an ON
(Continued)

current between the source of the first semiconductor element and the drain of the first semiconductor element, and a measured value of the ON voltage in the voltage measurement unit, and determines whether the plurality of semiconductor elements are in a normal state or in an overheated state based on the measured value of the ON voltage and the received information indicating the magnitude of the ON current.

10 Claims, 10 Drawing Sheets

(51) Int. Cl.
  *H02P 29/68* (2016.01)
  *H03K 17/0812* (2006.01)
  *H03K 17/08* (2006.01)
(52) U.S. Cl.
  CPC . *H03K 17/08122* (2013.01); *H02M 2001/325* (2013.01); *H02M 2001/327* (2013.01); *H03K 2017/0806* (2013.01)
(58) Field of Classification Search
  USPC .......................................... 327/378, 512, 513
  See application file for complete search history.

(56) References Cited

U.S. PATENT DOCUMENTS

| | | | |
|---|---|---|---|
| 2003/0072117 A1* | 4/2003 | Maekawa | H02M 1/08 361/86 |
| 2011/0068818 A1 | 3/2011 | Fukami | |
| 2015/0204730 A1 | 7/2015 | Daitoku et al. | |
| 2015/0311779 A1 | 10/2015 | Hayashiguchi et al. | |
| 2017/0097384 A1 | 4/2017 | Yamada et al. | |
| 2018/0154784 A1* | 6/2018 | Xu | B60L 11/1812 |

FOREIGN PATENT DOCUMENTS

| | | |
|---|---|---|
| JP | 2011-071174 A | 4/2011 |
| JP | 2014-064435 A | 4/2014 |
| JP | 2015-133894 A | 7/2015 |
| JP | 2015-171182 A | 9/2015 |
| JP | 2015-180162 A | 10/2015 |
| WO | 2014/069525 A1 | 5/2014 |

OTHER PUBLICATIONS

Written Opinion (PCT/ISA/237) dated Feb. 14, 2017, by the Japan Patent Office as the International Searching Authority for International Application No. PCT/JP2017/001206.

* cited by examiner

OVERHEAT PROTECTION CONTROL DEVICE AND VEHICLE-MOUNTED POWER CIRCUIT DEVICE

TECHNICAL FIELD

The present invention relates to an overheat protection control device and a vehicle-mounted power circuit device.

BACKGROUND ART

Recently, in particular in vehicle-mounted power circuit devices, higher output and size/weight reduction have been strongly demanded, and thus heat generation density of electronic components mounted in a power device is increasing. In addition, safety is also highly demanded in the vehicle-mounted power circuit devices. Accordingly, in some cases, for semiconductor elements which account for a large proportion of the cost of a vehicle-mounted power circuit device and whose failure leads to immediate stop of a vehicle, an overheat protection control device is mounted for the purpose of utilizing the performance of the semiconductor elements to the maximum and for the purpose of preventing a failure of the vehicle.

In a conventional overheat protection control device for semiconductor elements, a temperature sensor is arranged on each semiconductor element to measure the temperature of the semiconductor element, and overheat protection is applied by limiting an output such that the semiconductor element is not damaged. Applying overheat protection expands a temperature region in which the semiconductor element is used, improves the performance of the circuit device, and prevents a failure of the semiconductor element.

When the circuit device includes multiple semiconductor elements, the temperatures of the multiple semiconductor elements should be monitored. Accordingly, there has been proposed a device in which signals from temperature sensors are integrated via an input/output interface to reduce the number of input ports of a microcomputer with respect to the number of semiconductor elements and to downsize a temperature detection device (for example, PTD 1). In addition, there has been proposed a method of determining loss from a control command value and estimating the temperature of a semiconductor element using a predetermined thermal circuit network (for example, PTD 2).

CITATION LIST

Patent Document

PTD 1: Japanese Patent Laying-Open No. 2015-133894 (page 11, line 22 to page 13, line 30, FIG. 4)
PTD 2: Japanese Patent Laying-Open No. 2014-64435 (page 6, lines 32 to 48, FIG. 1)

SUMMARY OF INVENTION

Technical Problem

In overheat protection control devices described in PTDs 1 and 2, one temperature sensor is needed for one semiconductor element. When the temperature of a semiconductor element is measured, the temperature of the semiconductor element can be measured accurately by installing a temperature sensor on the semiconductor element.

However, a region where the temperature sensor is arranged serves as an invalid region through which current cannot flow. If the invalid region becomes large, the maximum current which can pass through the semiconductor elements is reduced, and loss caused when the current passes through the semiconductor elements is increased. This results in a decrease in the efficiency of a circuit device. The more semiconductor elements the circuit device has to use, the larger the invalid region becomes, causing a larger decrease in the efficiency of such a circuit device. In addition, if the size of the semiconductor elements is increased to compensate for degradation of the performance of the semiconductor elements, there occurs a problem that cost is significantly increased.

The present invention has been made to solve the aforementioned problems, and an object of the present invention is to provide an overheat protection control device capable of performing highly accurate overheat protection without an increase in an invalid region of semiconductor elements.

Solution to Problem

To solve the aforementioned problems, the present invention is directed to an overheat protection control device for a device including a plurality of semiconductor elements whose sources are commonly connected and whose drains are commonly connected, including: a voltage measurement unit configured to measure an ON voltage between the source of a first semiconductor element of the plurality of semiconductor elements and the drain of the first semiconductor element; and a determination unit configured to receive information indicating a magnitude of an ON current between the source of the first semiconductor element and the drain of the first semiconductor element, and a measured value of the ON voltage in the voltage measurement unit, and determine whether the plurality of semiconductor elements are in a normal state or in an overheated state based on the measured value of the ON voltage and the information indicating the magnitude of the ON current.

Advantageous Effects of Invention

According to the present invention, it can be determined whether the plurality of semiconductor elements are in the normal state or in the overheated state based on the ON current and the ON voltage, and thus highly accurate overheat protection can be performed without installing a temperature sensor on each semiconductor element.

DESCRIPTION OF EMBODIMENTS

Hereinafter, embodiments of the present invention will be described using the drawings.

First Embodiment

Hereinafter, a description will be given based on an example where an overheat protection control device according to the present invention is applied to a three-phase inverter device.

Figure 1:
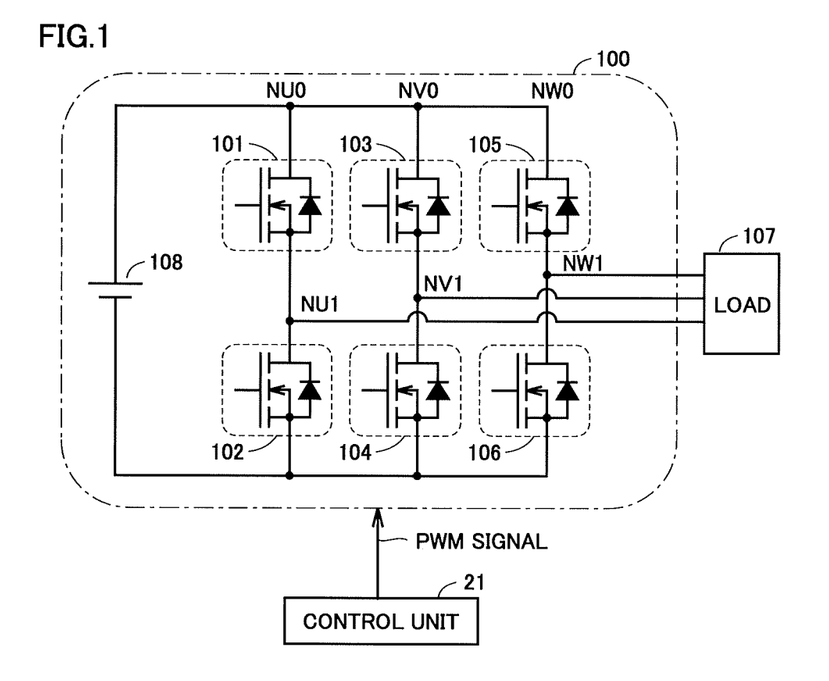
FIG. 1 is a circuit diagram of a three-phase inverter 100.
Figure 2A:
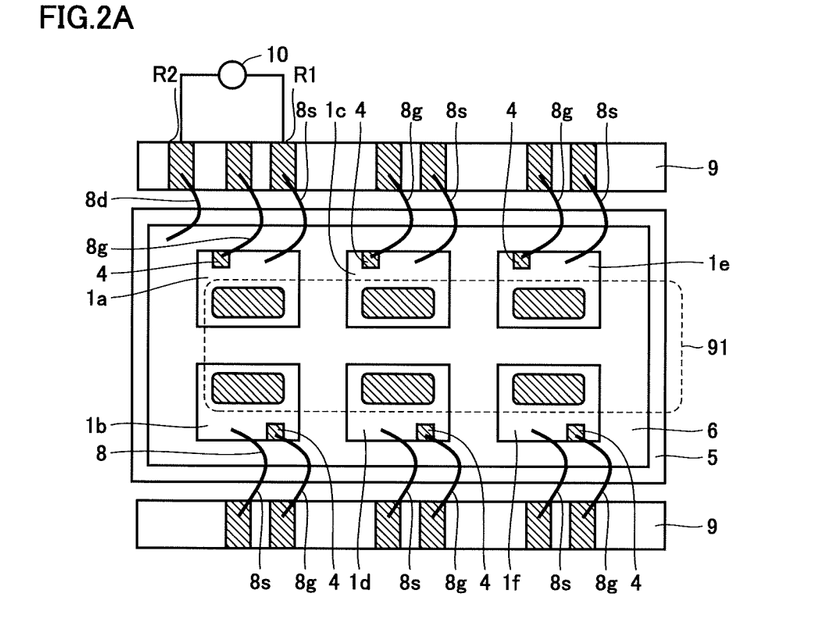
FIG. 2A is a view showing an example of an array of semiconductor elements in a portion of three-phase inverter 100 shown in FIG. 1.
Figure 2B:
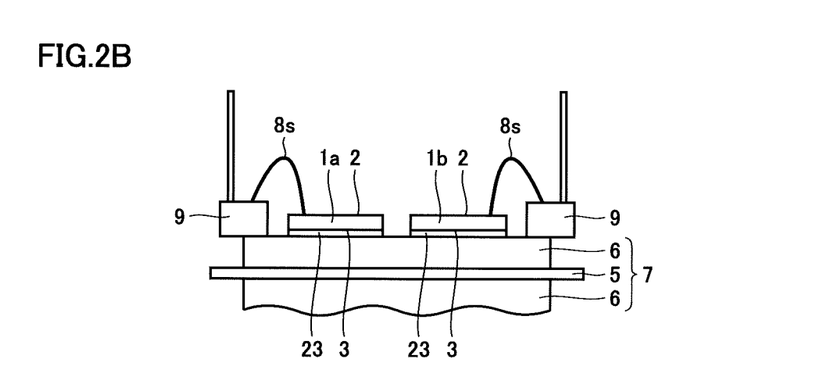
FIG. 2B is a view showing an example of the array of semiconductor elements in a portion of three-phase inverter 100 shown in FIG. 1.

FIG. 1 is a circuit diagram of a three-phase inverter 100. FIGS. 2A and 2B are each a view showing an example of an array of semiconductor elements in a portion of three-phase inverter 100 shown in FIG. 1.

As shown in FIG. 1, three-phase inverter 100 includes an A portion 101, a B portion 102, a C portion 103, a D portion 104, an E portion 105, and an F portion 106, between a power supply 108 and a load 107.

A portion 101 includes a U-phase upper switching element. B portion 102 includes a U-phase lower switching element. C portion 103 includes a V-phase upper switching element. D portion 104 includes a V-phase lower switching element. E portion 105 includes a W-phase upper switching element. F portion 106 includes a W-phase lower switching element. The switching elements in A portion 101, B portion 102, C portion 103, D portion 104, E portion 105, and F portion 106 are tuned ON/OFF based on a PWM (Pulse Width Modulation) signal from a control unit 21 configured to control three-phase inverter 100.

As shown in FIGS. 2A and 2B, in A portion 101 of three-phase inverter 100, three or more, for example six semiconductor elements 1a to 1f (for example, MOSFETs: Metal-Oxide-Semiconductor Field-Effect Transistors) made of silicon (Si), silicon carbide (SiC), or the like are arranged in parallel. Although measurement can also be performed using IGBTs (Insulated Gate Bipolar Transistor) in principle, MOSFETs are more suitably applied to the present invention, because MOSFETs have a significant change in temperature characteristics, and always have a positive temperature characteristic (i.e., resistance increases with an increase in temperature). Accordingly, the description will be given herein based on MOSFETs as an example. However, the present invention is not limited to MOSFETs. In the following description, semiconductor elements 1a to 1f may be collectively referred to as semiconductor elements 1.

An insulating substrate 7 is constituted by sandwiching a ceramic 5 between patterns 6 made of copper, aluminum, or the like. A terminal block 9 is made of resin having copper (Cu) inserted therein.

As shown in FIGS. 2A and 2B, a front surface of semiconductor element 1 as a MOSFET is referred to as a source 2, and a rear surface of semiconductor element 1 is referred to as a drain 3. A gate 4 is provided on a surface of source 2 to operate semiconductor element 1.

Semiconductor elements 1a to 1f are mounted on insulating substrate 7, using a bonding material 23 such as solder, for example. Drains 3 of semiconductor elements 1a to 1f are commonly connected to pattern 6 within insulating substrate 7. Thereby, the drains of semiconductor elements 1a to 1f have the same potential.

Sources 2 of semiconductor elements 1a to 1f are commonly connected to a metal wire 91 arranged above. Thereby, the sources of semiconductor elements 1a to 1f have the same potential.

Patterns 6 and semiconductor elements 1a to 1f are each externally connected using wires not shown, to form a circuit.

Sources 2 of semiconductor elements 1a to 1f are connected with parts of terminal block 9 where Cu is inserted, using metal wires 8s. Gates 4 of semiconductor elements 1a to 1f are connected with parts of terminal block 9 where Cu is inserted, using metal wires 8g. Drains 3 of semiconductor elements 1a to 1f are connected with pattern 6 via bonding material 23, and a part of pattern 6 is connected with a part of terminal block 9 where Cu is inserted, using a metal wire 8d.

In FIG. 2A, parts to which metal wires 8s, 8d, and 8g are connected are the parts where copper (Cu) is inserted. As metal wires 8s, 8g, and 8d, aluminum wires are mainly used. Insulating substrate 7 is connected to a cooler not shown. ON/OFF operation (switching) of semiconductor element 1 is controlled by applying a gate voltage Vgs to gate 4 and source 2, and when semiconductor element 1 is turned ON, it becomes conductive.

Figure 3:
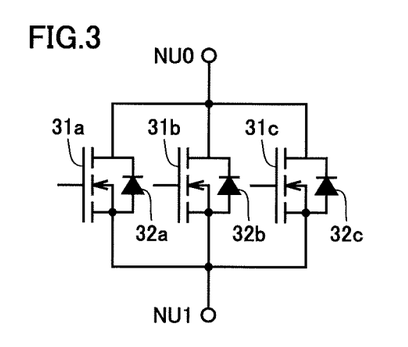
FIG. 3 is a view showing an example of a configuration of a plurality of semiconductor elements 1 included in an A portion 101.

FIG. 3 is a view showing an example of a configuration of a plurality of semiconductor elements 1 included in A portion 101.

A portion 101 includes a MOSFET 31a, a MOSFET 31b, and a MOSFET 31c connected in parallel between a node NU0 and a node NU1, and diodes 32a, 32b, and 32c connected in antiparallel with MOSFETs 31a, 31b, and 31c, respectively. It should be noted that, because of the structure of the MOSFETs, diodes 32a, 32b, and 32c may be body diodes included in the MOSFETs, and the arrangement in FIG. 2A is intended for the body diodes.

Sources and drains of MOSFET 31a, MOSFET 31b, and MOSFET 31c are each commonly connected, and each have the same potential.

Figure 4:
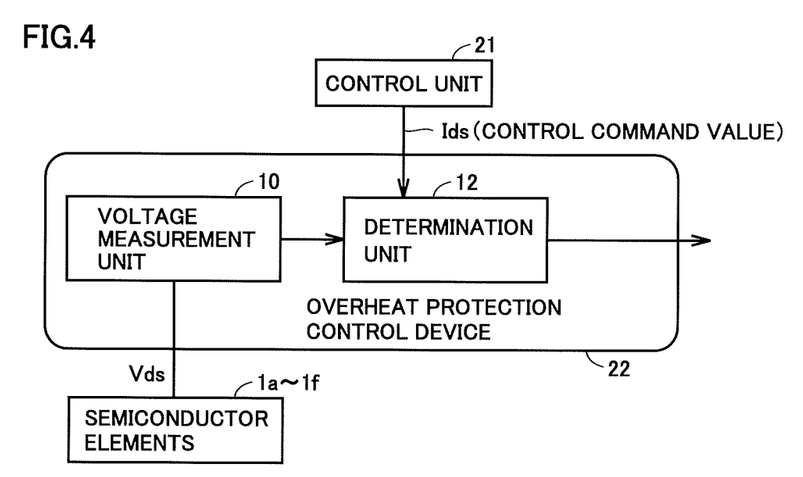
FIG. 4 is a view showing a configuration of an overheat protection control device 22 for the semiconductor elements in the first embodiment.

FIG. 4 is a view showing a configuration of an overheat protection control device 22 for the semiconductor elements in the first embodiment.

Overheat protection control device 22 includes a voltage measurement unit 10 and a determination unit 12.

Voltage measurement unit 10 measures an ON voltage Vds between source 2 and drain 3 of semiconductor element 1a, and sends ON voltage Vds to determination unit 12.

Figure 5:
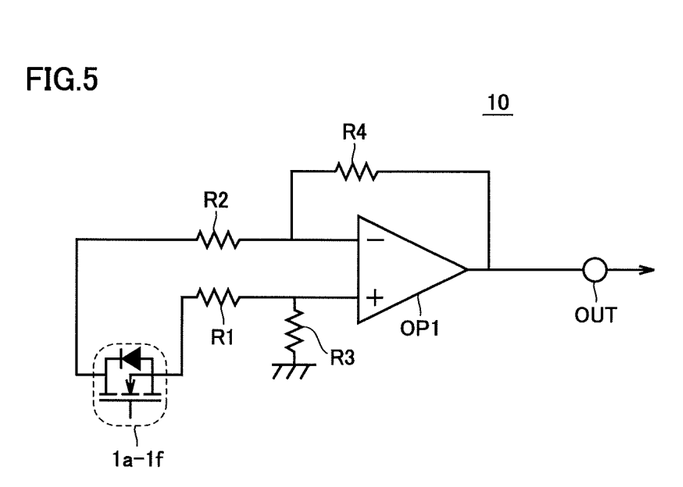
FIG. 5 is a view showing an example of a voltage measurement unit 10.

FIG. 5 is a view showing an example of voltage measurement unit 10.

As shown in FIG. 5, voltage measurement unit 10 is constituted of an operational amplifier OP1 and resistors R1 to R4.

Determination unit 12 receives ON voltage Vds from voltage measurement unit 10, and receives an ON current Ids, which is a control command value for semiconductor element 1a, from control unit 21. Determination unit 12 calculates an ON resistance Ron of semiconductor element 1a based on ON voltage Vds and ON current Ids of semiconductor element 1a.

Determination unit 12 determines whether or not ON resistance Ron exceeds a preset threshold value, and when ON resistance Ron exceeds the threshold value, determination unit 12 outputs to control unit 21 a request signal requesting that overheat protection be performed. Since the plurality of semiconductor elements 1a to 1f are arranged on insulating substrate 7, the sources of the plurality of semiconductor elements 1a to 1f have the same potential, and the drains of the plurality of semiconductor elements 1a to 1f have the same potential, ON resistance Ron exceeds the threshold value when the temperature of any semiconductor element 1 increases abnormally.

When control unit 21 receives the request signal requesting that overheat protection be performed, control unit 21 performs overheat protection, for example by suppressing an output, increasing the flow rate of cooling water, decreasing the temperature of the cooling water, or the like.

Figure 6:
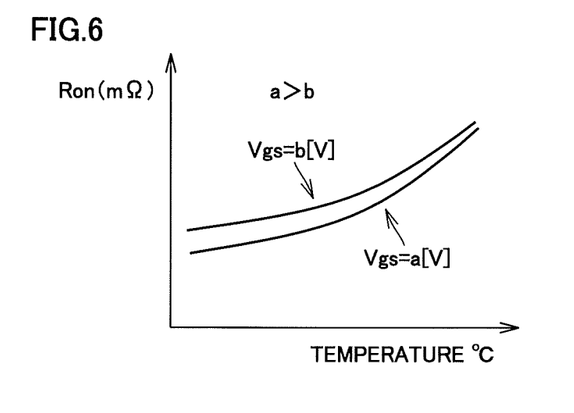
FIG. 6 is a view showing the relation between a temperature T and an ON resistance Ron of a MOSFET, for two types of gate voltages Vgs.

FIG. 6 is a view showing the relation between a temperature T and ON resistance Ron of a MOSFET, for two types of gate voltages Vgs.

As shown in FIG. 6, ON resistance Ron of the MOSFET increases with an increase in temperature. Therefore, by detecting whether or not ON resistance Ron is more than or equal to a determined first threshold value, it can be detected whether or not the temperature is more than or equal to a determined second threshold value. Further, since ON resistance Ron of the MOSFET is an electric resistance during conduction and Ohm's law applies, ON current Ids, ON voltage Vds, and ON resistance Ron are readily convertible. Accordingly, when ON current Ids and ON voltage Vds are measured, ON resistance Ron can be determined by simple calculation as expressed by Equation (1).

$$Ron = Vds/Ids \quad (1)$$

Since ON resistance Ron can be determined by executing a simple program, calculation load on determination unit 12 can be reduced.

Here, before describing the effectiveness of the present embodiment, a conventional problem will be described in more detail.

There are mainly two objects for which overheat protection is applied. One object is to prevent damage to semiconductor element 1 in a case where the temperature of semiconductor element 1 increases to exceed a temperature assumed during design due to degradation of thermal resistance associated with aging deterioration of a bonding portion or the like. The other object is to prevent damage to semiconductor element 1 in a case where it is driven in a mode which would not occur under normal control due to a certain factor. Examples of the mode which would not occur under normal control include a case where, in a three-phase inverter used to drive a motor, the motor is locked and current continues to flow into only one phase of the inverter. In such a case, the temperature of semiconductor element 1 may exceed the temperature assumed during design, and thus it is necessary to apply overheat protection. If the temperature of semiconductor element 1 is unknown on this occasion, it is necessary to perform control always assuming the worst state, and thus overheat protection is applied at a temperature lower than the temperature of semiconductor element 1 until which it is actually usable.

Accordingly, in conventional technology, the temperature of semiconductor element 1 is monitored to allow semiconductor element 1 to be utilized up to a temperature limit until which it is usable. By utilizing semiconductor element 1 up to the temperature limit until which it is usable, current passing through semiconductor element 1 can be increased, and thus an increase in loss equivalent to an increase in the temperature of semiconductor element 1 is permissible. Since the resistance value of semiconductor element 1 thereby increases, the size of semiconductor element 1 can be reduced.

Figure 7:
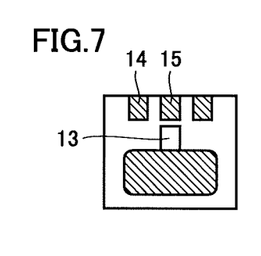
FIG. 7 is a plan view of a semiconductor element on which a temperature sensor is arranged according to conventional technology.

FIG. 7 is a plan view of a semiconductor element on which a temperature sensor is arranged according to the conventional technology. As shown in FIG. 7, conventionally, in semiconductor element 1 which needs overheat protection, a temperature sensor 13 is arranged on semiconductor element 1, and a cathode 14 and an anode 15 for detecting a signal of the temperature sensor are required. Since temperature sensor 13 and cathode 14 and anode 15 of temperature sensor 13 serve as invalid regions through which current cannot flow on a semiconductor chip, when they are mounted on semiconductor element 1, resistance during conduction increases. This is because, since semiconductor element 1 has a vertical structure and current flows from the front to the rear (or from the rear to the front) of the chip, if the area of a valid region which can constitute a transistor decreases, resistance increases accordingly.

In contrast, in the present embodiment, since temperature sensor 13 is not required on semiconductor element 1 and relevant cathode 14 and anode 15 of temperature sensor 13 are not required either, the area of the invalid regions through which current cannot flow can be reduced, and thus resistance during conduction of semiconductor element 1 decreases.

It should be noted that, although there is also a circuit device having temperature sensor 13 arranged on insulating substrate 7, such temperature sensor 13 cannot detect the temperature of semiconductor element 1 accurately. In addition, since it is difficult to predict from which semiconductor element, of semiconductor elements 1 mounted on insulating substrate 7, degradation of thermal resistance due to aging deterioration of a bonding portion or the like occurs, it is extremely difficult to arrange a temperature sensor on only a semiconductor element whose temperature will increase most. Therefore, it is necessary to assume a case where the temperature of semiconductor element 1 detected by temperature sensor 13 is not the highest temperature, and design semiconductor element 1 considering a large margin with respect to the limit temperature until which semiconductor element 1 is usable. Thus, it is not possible to fully utilize the performance of semiconductor element 1.

A semiconductor element made of Si can be manufactured to have a large size of about 15 mm. When the size of one semiconductor element is large, current which can be passed using one semiconductor element can be increased, and thus the number of semiconductor elements to be used can be reduced. By reducing the number of semiconductor elements to be used, the ratio of the area of the invalid regions formed of temperature sensor 13 of each semiconductor element and cathode 14 and anode 15 of each temperature sensor 13 to the area of the semiconductor chip is also reduced.

Therefore, it can be said that the semiconductor element made of Si has an advantage that semiconductor element 1 can be used up to the limit temperature by accurately measuring the temperature using temperature sensor 13, which surpasses its disadvantage that the maximum current which can be passed through the semiconductor chip is reduced (loss is increased) by the occurrence of the invalid regions.

In contrast, semiconductor element 1 made of SiC has an extremely poor manufacturing yield due to a failure resulting from a material defect of SiC, and it is required to constitute a circuit device using a plurality of small semiconductor elements. This is because a small semiconductor element has a better manufacturing yield, and thus constituting a circuit using a plurality of small semiconductor elements can significantly reduce the cost of the semiconductor elements, when compared with constituting a circuit using a large semiconductor element.

When it is necessary to use multiple small semiconductor elements, the ratio of the area of the invalid regions formed of temperature sensor 13 and cathode 14 and anode 15 of the temperature sensor to the area of each semiconductor element is increased, and the disadvantage that the maximum current which can be passed through the semiconductor chip is reduced (loss is increased) surpasses the advantage that semiconductor element 1 can be used up to the limit temperature by accurately measuring the temperature using temperature sensor 13.

Further, since the price of the SiC semiconductor element is very high, cost reduction associated with improved performance of the semiconductor element achieved by reducing an invalid area is more effective for the SiC semiconductor element, when compared with the Si semiconductor element.

Furthermore, when temperature sensor 13 detects the temperature of individual semiconductor element 1, there are such problems that the invalid regions increase, control load increases, and a control circuit unit for measuring temperature becomes large. Although downsizing of a circuit device is one of the features of SiC, when the control load increases and the control circuit unit for measuring temperature becomes large, a control substrate cannot be downsized, and it is difficult to downsize the entire circuit device.

In the present embodiment, the control load can be reduced and the control circuit unit for measuring temperature can be downsized, also contributing to downsizing of the entire circuit device. Although it is also conceivable to separately use a semiconductor element provided with a temperature sensor and a semiconductor element not provided with a temperature sensor, this technique causes an increase in the types of semiconductor elements as well as an increase in cost, and does not solve the problem that it is unknown from which semiconductor element 1, of semiconductor elements 1 mounted on insulating substrate 7, degradation of thermal resistance due to aging deterioration occurs.

According to the first embodiment for solving the aforementioned problem, since sources 2 and drains 3 of the plurality of semiconductor elements 1a to 1f are each arranged on the same potential, if the temperature of any one of semiconductor elements 1a to 1f arranged on insulating substrate 7 increases, detected ON voltage Vds changes, and thus temperature change can be detected. Although it is not possible to detect the temperature of each semiconductor element arranged on insulating substrate 7, it is possible to detect whether the temperature of any one of semiconductor elements 1a to 1f arranged on insulating substrate 7 exceeds a threshold value, and thus overheat protection can be performed.

In addition, since detected ON voltage Vds changes when the temperature of any one semiconductor element 1 arranged on insulating substrate 7 increases, there is no need to measure ON voltage Vds for each semiconductor element. As shown in FIG. 2A, voltage measurement unit 10 measures ON voltage Vds at one position in entire A portion 101, that is, a voltage between a part R1 of terminal block 9 where Cu is inserted, which is connected with source 2 of semiconductor element 1a via metal wire 8s, and a part R2 of terminal block 9 where Cu is inserted, which is connected with drain 3 of semiconductor element 1a via metal wire 8d.

As shown in FIG. 2B, source 2 is wired from each semiconductor element 1 because it is indispensable for controlling semiconductor element 1, whereas drain 3 only has to be wired from pattern 6 using only one wire. This can reduce metal wire 8d for detecting ON voltage Vds, and downsize terminal block 9. As a result, simple and small-sized overheat protection control device 22 can be implemented, and improvement in productivity and downsizing of the circuit device can be achieved.

It should be noted that, actually, the temperatures of semiconductor elements 1a to 1f embedded in the circuit device vary individually, due to characteristics variations in semiconductor elements 1a to 1f, control variations, shunt current variations caused by an inductance and the like of a wire not shown, and the like. However, in a case where output limitation or stop control is applied for overheat protection as described above, protection is required if even one of semiconductor elements 1a to 1f mounted in A portion 101, for example, has a significant temperature increase. In the present embodiment, it is detected whether or not the temperature of the semiconductor element having the highest temperature, of semiconductor elements 1a to 1f mounted in A portion 101, exceeds a threshold value, and thus overheat protection can be performed.

Although the description has been given so far taking A portion 101 as an example, actually, overheat protection can also be performed on B to F portions (102 to 106) using the same configuration as the configuration shown in FIGS. 2A and 2B. Overheat protection for three-phase inverter 100 can be performed by detecting ON resistances in at least A portion 101, B portion 102, and C portion 103, or D portion 104, E portion 105, and F portion 106. In addition, in a case where semiconductor elements 1a to 1f are IGBTs, sources 2 and drains 3 are replaced by emitters and collectors, respectively.

Therefore, in the case where the semiconductor elements are IGBTs, the portions described as the sources and the drains in the specification and the scope of the claims of the present application can indicate emitters and collectors, respectively. Alternatively, in a semiconductor device, a source or an emitter may be referred to as a first electrode, and a drain or a collector may be referred to as a second electrode.

Further, in a method for determining the temperature of a semiconductor element using a thermal circuit network as described in PTD 2, in order to deal with aging deterioration, it is necessary to modify the thermal circuit network in accordance with aging deterioration, or use a thermal circuit network which considers aging deterioration beforehand. Therefore, there are such problems that a system becomes complicated and a large margin is required for an overheat protection temperature. In the embodiment described above, a thermal circuit network is not used to determine the temperature of the semiconductor element, which does not cause such problems that a system becomes complicated and a large margin is required for an overheat protection temperature.

Second Embodiment

To be accurate, ON voltage Vds is detected to include temperature characteristics of an electric resistance of a metal in a path of an ON current Ion of pattern 6. Pattern 6 is an electric resistor, and the electric resistance increases with an increase in temperature, as in a MOSFET. Since the temperature of pattern 6 also increases along with the temperature of semiconductor element 1, if there is a large increase in electric resistance due to temperature characteristics of pattern 6, the temperature of semiconductor element 1 cannot be estimated accurately. The temperature can be measured more accurately by removing an electric resistance component of pattern 6 as much as possible.

Figure 8:
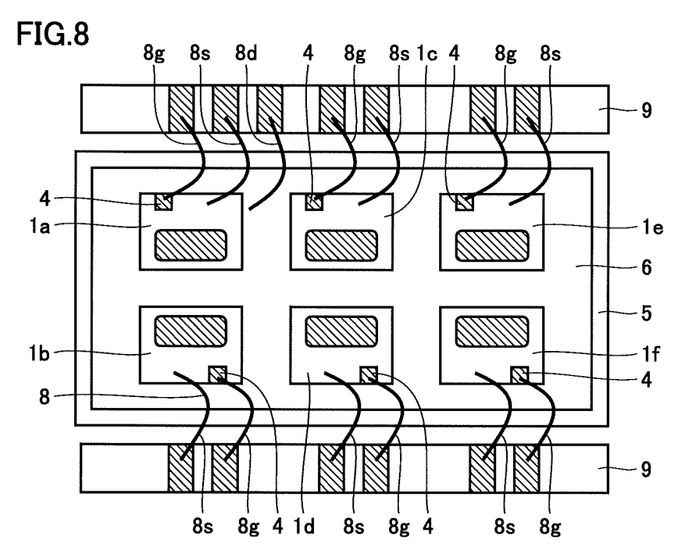
FIG. 8 is a view showing another example of the array of semiconductor elements in a portion of three-phase inverter 100.

FIG. 8 is a view showing another example of the array of semiconductor elements in a portion of three-phase inverter 100. Extraction of a drain in a second embodiment is different from extraction of the drain in the first embodiment.

As shown in FIG. 8, one end of metal wire 8d for drain 3 is connected with the vicinity of semiconductor element 1a on pattern 6. The other end of metal wire 8d for drain 3 is connected with a part of terminal block 9 where Cu is inserted.

By connecting the one end of metal wire 8d for drain 3 with the vicinity of semiconductor element 1a on pattern 6, the temperatures of semiconductor elements 1a to 1f can be estimated more accurately, and a small-sized, high-output circuit device can be implemented.

Further, in a case where semiconductor elements 1a to 1f are MOSFETs, even when thermal resistance is degraded and the temperature increases abnormally in one semiconductor element 1 mounted on insulating substrate 7, ON resistance Ron of semiconductor element 1 which is a MOSFET increases with the increase in temperature, and thereby current is less likely to flow into semiconductor element 1 whose temperature increases abnormally, and more current flows into other semiconductor elements 1. As a result, losses in other semiconductor elements 1 are increased, and thereby the temperatures of semiconductor elements 1 mounted on insulating substrate 7 change to be identical.

Therefore, the one end of metal wire 8d for drain 3 may be connected with the vicinity of any of semiconductor elements 1a to 1f on pattern 6. In FIG. 8, the one end of metal wire 8d for drain 3 is connected with a part between semiconductor element 1a and semiconductor element 1b on pattern 6. In a case where the plurality of semiconductor elements 1 are used, a gap is often provided between adjacent semiconductor elements 1 to avoid degradation of thermal resistance due to thermal interference of semiconductor elements 1. By effectively utilizing such a space with metal wire 8d for drain 3, three-phase inverter 100 can be downsized.

Third Embodiment

Figure 9:
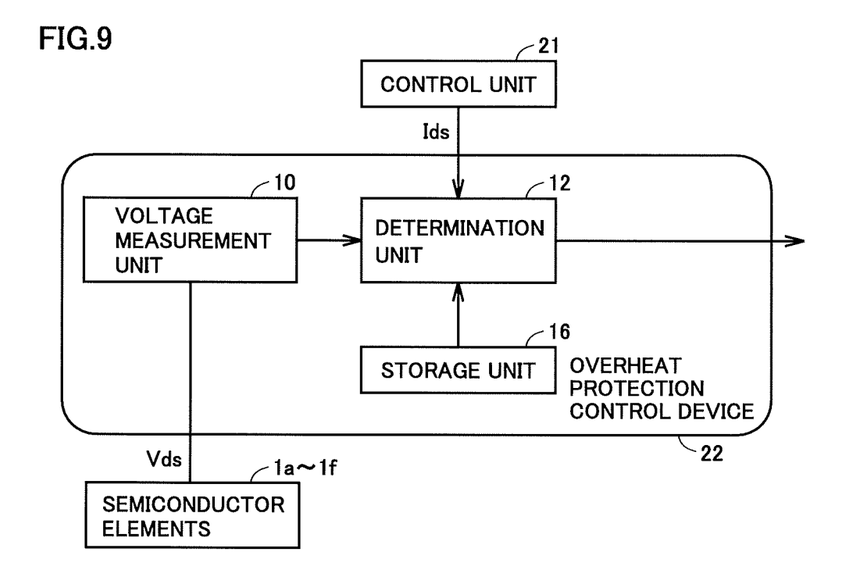
FIG. 9 is a view showing a configuration of overheat protection control device 22 for semiconductor elements in a third embodiment.

FIG. 9 is a view showing a configuration of overheat protection control device 22 for semiconductor elements in a third embodiment.

In addition to the configuration in the first embodiment, overheat protection control device 22 in the third embodiment includes a storage unit 16.

Semiconductor elements 1a to 1f have characteristics variations. By storing the characteristics variations in storage unit 16, it becomes possible to correct characteristics of semiconductor elements 1a to 1f.

Figure 10:
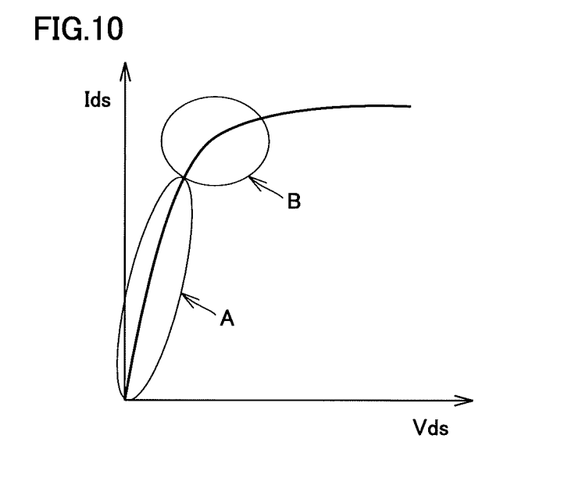
FIG. 10 is a view showing the relation between an ON voltage Vds and an ON current Ids in the third embodiment.

FIG. 10 is a view showing the relation between ON voltage Vds and ON current Ids in the third embodiment. In a small current region as indicated by A, in the case of a MOSFET, ON resistance Ron of semiconductor element 1 is determined by gate voltage Vgs. However, in a large current region as indicated by B, ON resistance Ron is not determined by Vgs alone, and as ON current Ids increases, ON voltage Vds increases, that is, ON resistance Ron increases.

Although a region where ON voltage Vds increases may not be used, such a region is also often used for achieving a small-sized, higher-output circuit device in recent years. In a region where ON resistance Ron increases due to ON current Ids, ON resistance Ron changes due to ON current Ids in addition to the temperature, and thus ON resistance Ron at 170° C. and 300 A may be identical to ON resistance Ron at 175° C. and 250 A, for example. In such a case, it is necessary to apply control considering a margin of 5° C. However, control which further reduces a margin can be performed by storing the relation between the temperature and both of ON voltage Vds and ON current Ids in storage unit 16. As a result, semiconductor elements 1a to 1f are downsized, and small-sized, high-output, and highly safe three-phase inverter 100 can be implemented.

However, as shown in FIG. 6, at a higher temperature, ON resistance Ron determined by gate voltage Vgs has a smaller variation. Depending on the temperature characteristics of semiconductor element 1, it is not necessarily required to consider variations in ON resistance Ron determined by gate voltage Vgs.

The temperature at which overheat protection is applied is a high temperature such as 175° C., for example. Accordingly, measurement accuracy is not required in a room temperature region such as at 25° C. Thus, it is only necessary to input the relation between the temperature and both of ON voltage Vds and ON current Ids in storage unit 16, only for the large current region within a current region assumed to be used in the vicinity of the temperature at which overheat protection is applied. In other words, it is only necessary to store such a relation only for a region where ON resistance Ron increases with an increase in ON current Ids. Thereby, control load and test load can be reduced, and cost reduction, downsizing, and improved productivity can be achieved for overheat protection control device 22.

Here, the reasons for not storing the relation between the temperature and both of ON voltage Vds and ON current Ids for the low current region are that ON resistance Ron is a region determined by gate voltage Vgs, and that the MOSFET is a resistor, conduction loss is a dominant loss, the conduction loss increases with the square of current, and thus a current of about 10 A generates heat which is only about 1/100 of the heat generated at 100 A, so there can be assumed no situation where overheat protection should be applied.

Referring to FIG. 9, storage unit 16 stores a table which defines the relation between the temperature and both of ON voltage Vds and ON current Ids of semiconductor element 1a, at the time of an intermediate inspection or at the time of a shipping inspection.

When determination unit 12 receives ON voltage Vds of semiconductor element 1a measured in voltage measurement unit 10 and ON current Ids of semiconductor element 1a which is a control command value from control unit 21, determination unit 12 refers to the table within storage unit 16, and specifies a temperature corresponding to these ON voltage Vds and ON current Ids.

When the specified temperature exceeds a predetermined threshold value, determination unit 12 outputs to control unit 21 a request signal requesting that overheat protection be performed.

It should be noted that, in the case of not using the region where ON resistance Ron increases with an increase in ON current Ids, the ON resistance is determined by the temperature and gate voltage Vgs. In such a case, simpler control can be performed. For example, ON resistance Ron at which overheat protection should be applied is determined by passing any current at the temperature at which overheat protection is applied.

Fourth Embodiment

Figure 11:
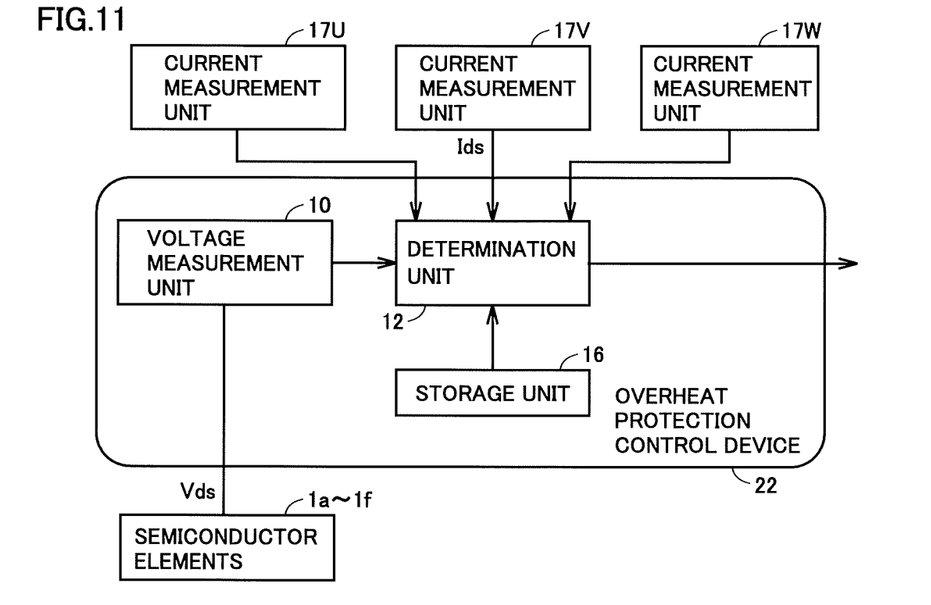
FIG. 11 is a view showing a configuration of overheat protection control device 22 for semiconductor elements in a fourth embodiment.

FIG. 11 is a view showing a configuration of overheat protection control device 22 for semiconductor elements in a fourth embodiment.

This overheat protection control device 22 includes current measurement units 17U, 17V, and 17W.

Figure 12:
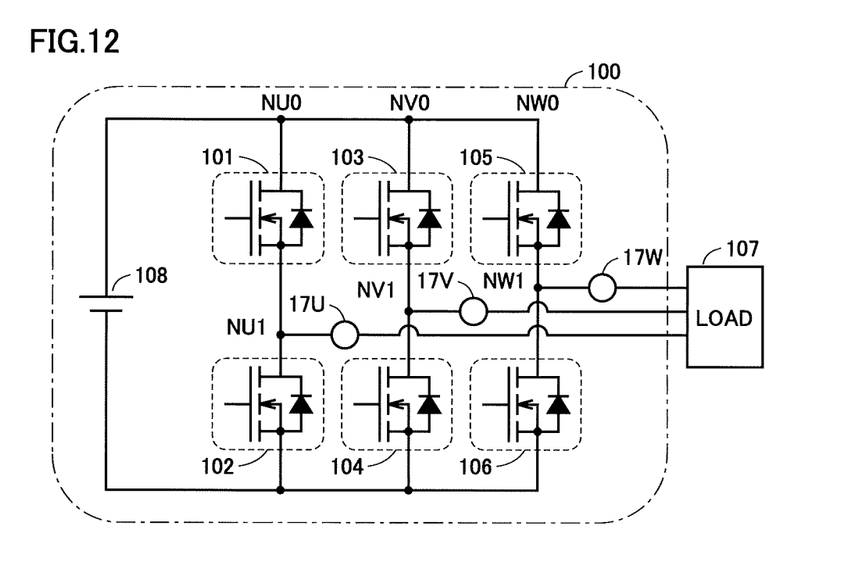
FIG. 12 is a view showing an example of positions for placing current measurement units 17U, 17V, and 17W.

FIG. 12 is a view showing an example of positions for placing current measurement units 17U, 17V, and 17W.

Current measurement unit 17U is provided between load 107 and node NU1 which is between A portion 101 including the U-phase upper switching element and B portion 102 including the U-phase lower switching element. Current measurement unit 17V is provided between load 107 and a node NV1 which is between C portion 103 including the V-phase upper switching element and D portion 104 including the V-phase lower switching element. Current measurement unit 17W is provided between load 107 and a node NW1 which is between E portion 105 including the W-phase upper switching element and F portion 106 including the W-phase lower switching element.

In the first embodiment, the control command value from control unit 21 is used as a current value used in determination unit 12. In contrast, in the fourth embodiment, current measurement units 17U, 17V, and 17W measure ON current Ids and output it to determination unit 12. Determination unit 12 calculates ON resistance Ron using measured ON current Ids.

By using the current value measured by current measurement units 17U, 17V, and 17W, a current value which is more accurate than the control command value can be obtained. As a result, the ON resistance can be calculated more accurately, and thus it is possible to utilize the performance of semiconductor elements 1 to the maximum. By utilizing the performance of semiconductor elements 1 to the maximum, cost reduction by size reduction of semiconductor elements 1 can be achieved. Further, since the temperature can be estimated accurately, the reliability of three-phase inverter 100 is also improved.

It should be noted that, in a vehicle-mounted circuit device mounted in a hybrid vehicle or the like, a current measurement unit is installed for controlling a motor. Therefore, if a signal of the current measurement unit used for controlling the motor is shared, the present embodiment is applicable without cost increase, without the need to provide a new current measurement unit. Further, since there is no additional component, a small-sized three-phase inverter can be implemented.

Fifth Embodiment

Figure 13:
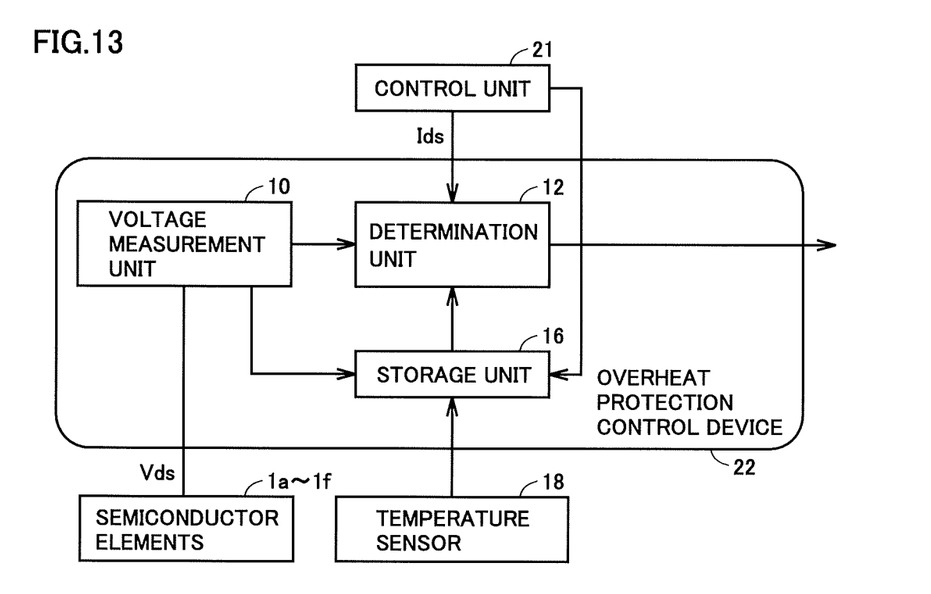
FIG. 13 is a view showing a configuration of overheat protection control device 22 for semiconductor elements in a fifth embodiment.

FIG. 13 is a view showing a configuration of overheat protection control device 22 for semiconductor elements in a fifth embodiment.

Overheat protection control device 22 in the fifth embodiment includes storage unit 16.

When the temperature of a cooler does not change, it is considered that the temperatures of semiconductor elements 1 do not change, either. For example, in a case where three-phase inverter 100 outputs electric power P when a cooler has temperature T and semiconductor elements 1 have ON voltage Vds, and then three-phase inverter 100 outputs identical electric power P when the cooler has identical temperature T after a lapse of a certain period, if there is no aging deterioration such as degradation of thermal resistance, the ON voltage of semiconductor elements 1 is also equal to previous ON voltage Vds. If there is aging deterioration such as degradation of thermal resistance, the ON voltage of semiconductor elements 1 is greater than previous ON voltage Vds.

Therefore, in the case where the temperatures detected by a temperature sensor 18 at two time points are identical and electric powers output by the circuit device at the two time points are also identical, if the ON voltages at the two time points are identical, determination unit 12 determines that there is no aging deterioration such as degradation of thermal resistance in semiconductor elements 1, and if there is an increase in the ON voltage, determination unit 12 determines that there is aging deterioration such as degradation of thermal resistance in semiconductor elements 1.

Temperature sensor 18 detects the temperature of the cooler configured to cool semiconductor elements 1a to 1f.

Storage unit 16 stores a table which defines the relation between ON voltage Vds of semiconductor element 1a and both of temperature T of the cooler output from temperature sensor 18 and electric power P output from three-phase inverter 100 including semiconductor elements 1a to 1f.

Determination unit 12 refers to the table in storage unit 16, and specifies an ON voltage Vds(n) of semiconductor element 1a corresponding to the temperature of the cooler detected at a certain time point t and electric power P output from three-phase inverter 100 at certain time point t. If an ON voltage Vds(d) of semiconductor element 1a detected at certain time point t is greater than specified ON voltage Vds(n) by a threshold value or more, determination unit 12 determines that the plurality of semiconductor elements 1a to 1f are in a normal state, and if ON voltage Vds(d) is not greater than specified ON voltage Vds(n) by the threshold value or more, determination unit 12 determines whether the plurality of semiconductor elements 1a to 1f are in an overheated state.

It should be noted that, in a case where a three-phase inverter for driving a motor mounted in a hybrid vehicle is taken as an example, if overheat protection is applied suddenly during driving and an output changes, a driver gets stressed and feels uncomfortable. In addition, even if an abnormality occurs, it is required to enable the driver to safely move the vehicle to a safe place. In such a product, a safer product can be implemented by determining aging deterioration and abnormal control, informing the driver before applying overheat protection, and gently applying protection under control.

Sixth Embodiment

Figure 14:
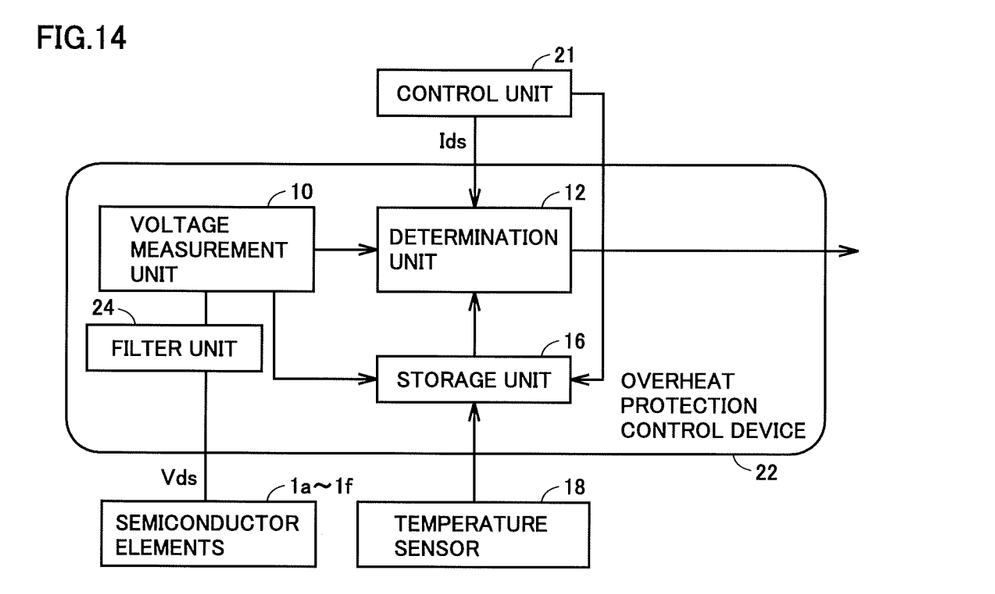
FIG. 14 is a view showing a configuration of overheat protection control device 22 for semiconductor elements in a sixth embodiment.

FIG. 14 is a view showing a configuration of overheat protection control device 22 for semiconductor elements in a sixth embodiment.

Overheat protection control device 22 in the sixth embodiment is different from overheat protection control device 22 in the fifth embodiment in that overheat protection control device 22 in the sixth embodiment includes a filter unit 24.

Filter unit 24 is installed at a preceding stage of an output terminal of voltage measurement unit 10. For example, filter unit 24 may be installed at a preceding stage of an input terminal of voltage measurement unit 10, or may be installed between the input terminal and the output terminal of voltage measurement unit 10.

Although overheat protection control device 22 in the present embodiment is implemented by providing filter unit 24 to overheat protection control device 22 in the fifth embodiment, it may be implemented by providing filter unit 24 to overheat protection control device 22 in any of the first to fourth embodiments.

Figure 15:
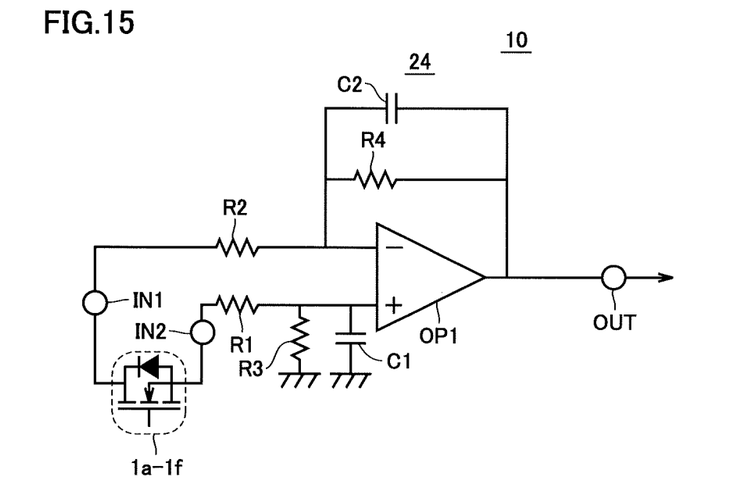
FIG. 15 is a view showing an example of voltage measurement unit 10 and a filter unit 24.

FIG. 15 is a view showing an example of voltage measurement unit 10 and filter unit 24.

Filter unit 24 is constituted of capacitors C1 and C2. Filter unit 24 in FIG. 15 is arranged between input terminals IN1, IN2 and an output terminal OUT of voltage measurement unit 10.

Since a large current flows into semiconductor elements 1 and pattern 6, noise is mixed into a signal detected by voltage measurement unit 10. Accordingly, by mounting filter unit 24 such as a low pass filter, for example, at a preceding stage of output terminal OUT of voltage measurement unit 10, voltage can be detected more accurately. Thereby, accuracy of overheat protection can be improved. When the accuracy of overheat protection is improved, the performance of semiconductor elements 1 can be further elicited. As a result, device downsizing and cost reduction can be achieved.

Since the noise level changes depending on the current flowing into semiconductor elements 1 and pattern 6, filter unit 24 which can actively change a threshold value in response to an input may be used.

It should be noted that, although the first to sixth embodiments have described overheat protection for semiconductor elements 1, it is also possible in the present invention that voltage measurement unit 10 detects reduction of the ON voltage and applies short circuit protection for semiconductor elements 1, because voltage measurement unit 10 measures the ON voltage. This eliminates a control circuit for short circuit protection, and can achieve device downsizing.

Although SiC is used as an example of the semiconductor elements in the description in the first to sixth embodiments, the present invention is also applicable to GaN and other compound semiconductors, because they have the same problem as SiC.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST 1a to 1f: semiconductor element; 2: source; 3: drain; 4: gate; 5: ceramic; 6: pattern; 7: insulating substrate; 8s, 8d, 8g: metal wire; 9: terminal block; 10: voltage measurement unit; 12: determination unit; 13: temperature sensor; 14: cathode; 15: anode; 16: storage unit; 17: current measurement unit; 18: temperature sensor; 21: control unit; 22: overheat protection control device; 23: bonding material; 24: filter unit; 100: three-phase inverter; 101: A portion; 102: B portion; 103: C portion; 104: D portion; 105: E portion; 106: F portion; 107: load; 108: power supply; R1 to R4: resistor; C1, C2: capacitor; OP1: operational amplifier; IN1, IN2: input terminal of voltage measurement unit; OUT: output terminal of voltage measurement unit.

The invention claimed is:

1. An overheat protection control device for a device including a plurality of semiconductor elements whose sources are commonly connected and whose drains are commonly connected, comprising:
   a voltage measurement unit configured to measure an ON voltage between the source of a first semiconductor element of the plurality of semiconductor elements and the drain of the first semiconductor element;
   a storage unit configured to store information indicating relation between a temperature of the first semiconductor element and both of the ON voltage and an ON current between the source of the first semiconductor element and the drain of the first semiconductor element; and
   a determination unit configured to receive information indicating a magnitude of the ON current, and a measured value of the ON voltage in the voltage measurement unit, refer to the information within the storage unit, specify a temperature corresponding to the measured value of the ON voltage and the magnitude of the ON current indicated by the received information, and determine whether the plurality of semiconductor elements are in a normal state or in an overheated state based on the temperature.

2. The overheat protection control device according to claim 1, comprising a control unit configured to output a control command value commanding a value of the ON current, wherein
   the determination unit is configured to receive the control command value as the information indicating the magnitude of the ON current.

3. The overheat protection control device according to claim 1, comprising a current measurement unit configured to measure the ON current, wherein
   the determination unit is configured to receive a measured value of the ON current as the information indicating the magnitude of the ON current.

4. The overheat protection control device according to claim 1, wherein
   the drains of the plurality of semiconductor elements are connected to a metal pattern on a substrate via a bonding material, and
   the overheat protection control device comprises:
      a plurality of first metal wires configured to connect the sources of the plurality of semiconductor elements and a terminal block; and a second metal wire configured to connect a portion close to the first semiconductor element on the pattern and the terminal block.

5. The overheat protection control device according to claim 1, comprising a filter unit configured to remove noise, at a preceding stage of an output terminal of the voltage measurement unit.

6. The overheat protection control device according to claim 1, wherein the voltage measurement unit is configured to detect reduction of the ON voltage and perform short circuit protection for the semiconductor elements.

7. The overheat protection control device according to claim 1, wherein the plurality of semiconductor elements are made of a compound semiconductor, and a temperature sensor is not placed on any of the plurality of semiconductor elements.

8. A vehicle-mounted power circuit device comprising a three-phase inverter to which the overheat protection control device according to claim 7 is applied.

9. The overheat protection control device according to claim 1, wherein the information within the storage unit includes relation between the temperature of the first semiconductor element and both of the ON voltage and the ON current in a large current region.

10. An overheat protection control device for a device including a plurality of semiconductor elements whose sources are commonly connected and whose drains are commonly connected, comprising:
 a voltage measurement unit configured to measure an ON voltage between the source of a first semiconductor element of the plurality of semiconductor elements and the drain of the first semiconductor element;
 a storage unit configured to store information indicating relation between the ON voltage and both of a temperature of a cooler configured to cool the plurality of semiconductor elements and electric power output from a power conversion device including the plurality of semiconductor elements; and
 a determination unit configured to refer to the information within the storage unit, specify an ON voltage corresponding to the temperature of the cooler detected at a certain time point and the electric power output from the power conversion device at the certain time point, and determine whether the plurality of semiconductor elements are in a normal state or in an overheated state based on the specified ON voltage and a measured value of the ON voltage.

* * * * *